United States Patent
Katagiri et al.

(10) Patent No.: US 6,867,502 B2
(45) Date of Patent: Mar. 15, 2005

(54) SEMICONDUCTOR DEVICE

(75) Inventors: Mitsuaki Katagiri, Nishitokyo (JP); Masami Usami, Ome (JP); Kenji Ujiie, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/369,764

(22) Filed: Feb. 21, 2003

(65) Prior Publication Data

US 2003/0168748 A1 Sep. 11, 2003

(30) Foreign Application Priority Data

Mar. 8, 2002 (JP) ........................................ 2002-063623

(51) Int. Cl.$^7$ ......................... H01L 23/48; H01L 23/52; H01L 29/40
(52) U.S. Cl. ....................... 257/778; 257/737; 257/738; 438/108; 438/613; 438/617
(58) Field of Search ......................... 257/778, 737–738; 438/108, 613–617; 228/180.22

(56) References Cited

U.S. PATENT DOCUMENTS

| | | | |
|---|---|---|---|
| 5,849,606 A | | 12/1998 | Kikuchi et al. |
| 5,862,096 A | * | 1/1999 | Yasuda et al. ............... 365/229 |
| 6,178,108 B1 | * | 1/2001 | Miyatake et al. ........... 365/149 |
| 6,222,272 B1 | * | 4/2001 | Takayama et al. .......... 257/773 |
| 6,472,745 B1 | * | 10/2002 | Iizuka ........................ 257/723 |
| 6,477,046 B1 | * | 11/2002 | Stearns et al. .............. 361/704 |
| 6,563,299 B1 | * | 5/2003 | Van Horn et al. ........ 324/158.1 |
| 2001/0013662 A1 | * | 8/2001 | Kudou et al. ................ 257/784 |
| 2003/0112695 A1 | * | 6/2003 | Fujisawa et al. ....... 365/230.03 |
| 2003/0151100 A1 | * | 8/2003 | Toyoshima et al. ......... 257/393 |
| 2004/0007778 A1 | * | 1/2004 | Shinozaki et al. .......... 257/759 |

FOREIGN PATENT DOCUMENTS

| | | |
|---|---|---|
| JP | 08-097313 | 4/1996 |
| JP | 2001-015554 | 1/2001 |

* cited by examiner

*Primary Examiner*—Amir Zarabian
*Assistant Examiner*—Thanh Y. Tran
(74) *Attorney, Agent, or Firm*—Mattingly, Stanger & Malur, P.C.

(57) ABSTRACT

A flip-chip BGA is disclosed which exhibits an excellent high-speed electric transmission characteristic while minimizing the formation of voids in sealing resin filled between a semiconductor chip and a wiring substrate. A silicon chip is flip-chip-mounted on a package substrate, and in a central area of a main surface of the silicon chip are arranged a power supply circuit, an input/output circuit, and plural bonding pads, while in the other area than the central area are arranged solder bumps in a matrix form, the solder bumps being electrically connected to the bonding pads through Cu wiring. Of the solder bumps, solder bumps for input/output power supply and solder bumps for the input and output of a data signal are arranged in a first area adjacent to the central area, and solder bumps for address signal input are arranged in a second area located outside the first area.

18 Claims, 22 Drawing Sheets

SEMICONDUCTOR DEVICE

BACKGROUND OF THE INVENTION

The present invention relates to a semiconductor device and more particularly to a technique applicable effectively to a semiconductor device of a BGA (Ball Grid Array) structure wherein a semiconductor chip is flip-chip-mounted onto a wiring substrate, the semiconductor chip being fabricated using what is called a wafer process package (WPP) technique involving carrying out a package process by the application of a wafer process (pre-process).

BGA (Ball Grid Array), which is a kind of a semiconductor package, has a structure wherein a large number of bump electrodes formed by solder for example are arrayed on a main surface of a semiconductor chip with an integrated circuit formed thereon.

When mounting the BGA onto a wiring substrate, it is usually necessary that a gap between the BGA and the wiring substrate be filled with a sealing resin called under-fill resin to protect a connection between the BGA and the wiring substrate.

However, the under-fill resin is poured into the gap between the BGA and the wiring substrate by a capillary action, so if the arrangement of bump electrodes is irregular, the flow of the resin becomes non-uniform and voids not filled with the resin are formed partially, thus giving rise to the problem that the connection reliability between the BGA and the wiring substrate is deteriorated.

A countermeasure to the aforesaid formation of voids during the pouring of under-fill resin is publicly known in Japanese Published Unexamined Patent Application No. Hei 8 (1996)-97313 for example. This publication discloses a technique wherein protuberances such as dummy bumps are formed in a bump electrode-free region on a main surface of a semiconductor chip to improve the flow of sealing resin based on a capillary action.

Japanese Published Unexamined Patent Application No. 2001-15554 discloses a technique wherein plural parallel or radial grooves are formed in an insulating protective film such as solder resist which covers a surface of a wiring substrate (circuit board) with a semiconductor chip mounted thereon. When sealing resin is poured between the semiconductor chip and the circuit board, the liquid resin flows smoothly through the aforesaid grooves, so that clogging and the formation of bubbles are prevented and the formation of voids is suppressed.

SUMMARY OF THE INVENTION

The present inventors have already developed a BGA wherein a SRAM (Static Random Access Memory) chip used for example as a cache memory in a work station is flip-chip-mounted on a wiring substrate.

This type of a high-speed SRAM is required to possess a high-speed electric transmission characteristic and therefore it is necessary that semiconductor chip-side power supply wiring and wiring substrate-side power supply wiring, as well as signal wiring, be made as short as possible.

However, if there is adopted a wiring layout with priority given to a high-speed electric transmission characteristic, there arises a restriction on the layout of bump electrodes, which layout becomes irregular. Consequently, when sealing resin is poured between a semiconductor chip and a wiring substrate, a void is formed in a portion where the layout of bump electrodes is irregular. If the void is small in size, it does not pose a serious problem, but in the case of such a large void as spans plural bump electrodes, there is a fear that bump electrodes located inside the void may cause a short-circuit when high heat is applied to the wiring substrate for example at the time of mounting BGA onto a mother board.

Therefore, in case of developing such a BGA for a high-speed SRAM as mentioned above, it is required to make a wiring design capable of attaining a high-speed electric transmission characteristic while minimizing the formation of void.

It is an object of the present invention to provide a technique capable of attaining a flip chip BGA superior in high-speed electric transmission characteristic.

It is another object of the present invention to provide a technique capable of improving the reliability of a flip chip BGA superior in high-speed electric transmission characteristic.

The above and other objects and novel features of the present invention will become apparent from the following description and the accompanying drawings.

Typical modes of the present invention as disclosed herein will be outlined below.

According to the present invention there is provided a semiconductor device wherein a semiconductor chip is flip-chip-mounted onto a wiring substrate through a plurality of bump electrodes formed on a main surface of the semiconductor chip, characterized in that a power supply circuit, an input/output circuit, and a plurality of pads are arranged in a central area of the main surface of the semiconductor chip; a plurality of bump electrodes are arrayed in the other area than the central area of the main surface of the semiconductor chip, the bump electrodes being electrically connected to the pads through metal wiring; of the plural bump electrodes, those for input/output power supply and those for the input and output of a data signal are mainly arranged in a first area adjacent to the central area of the main surface of the semiconductor chip; and bump electrodes for the input of an address signal are mainly arranged in a second area located outside the first area.

Between the first and second areas of the semiconductor chip is provided a third area in which is disposed a portion of the metal wiring which portion connects the bump electrodes for the input of an address signal and the pads with each other. On the other hand, on a surface of the wiring substrate are formed a plurality of electrode pads to which are connected the bump electrodes for an input/output power supply, and in the interior of the wiring substrate is formed a power plane which is electrically connected to the electrode pads via through holes, the through holes being arranged in an area opposed to the third area of the semiconductor chip.

DETAILED DESCRIPTION OF THE PREFERRED EMBODIMENTS

Figure 1:
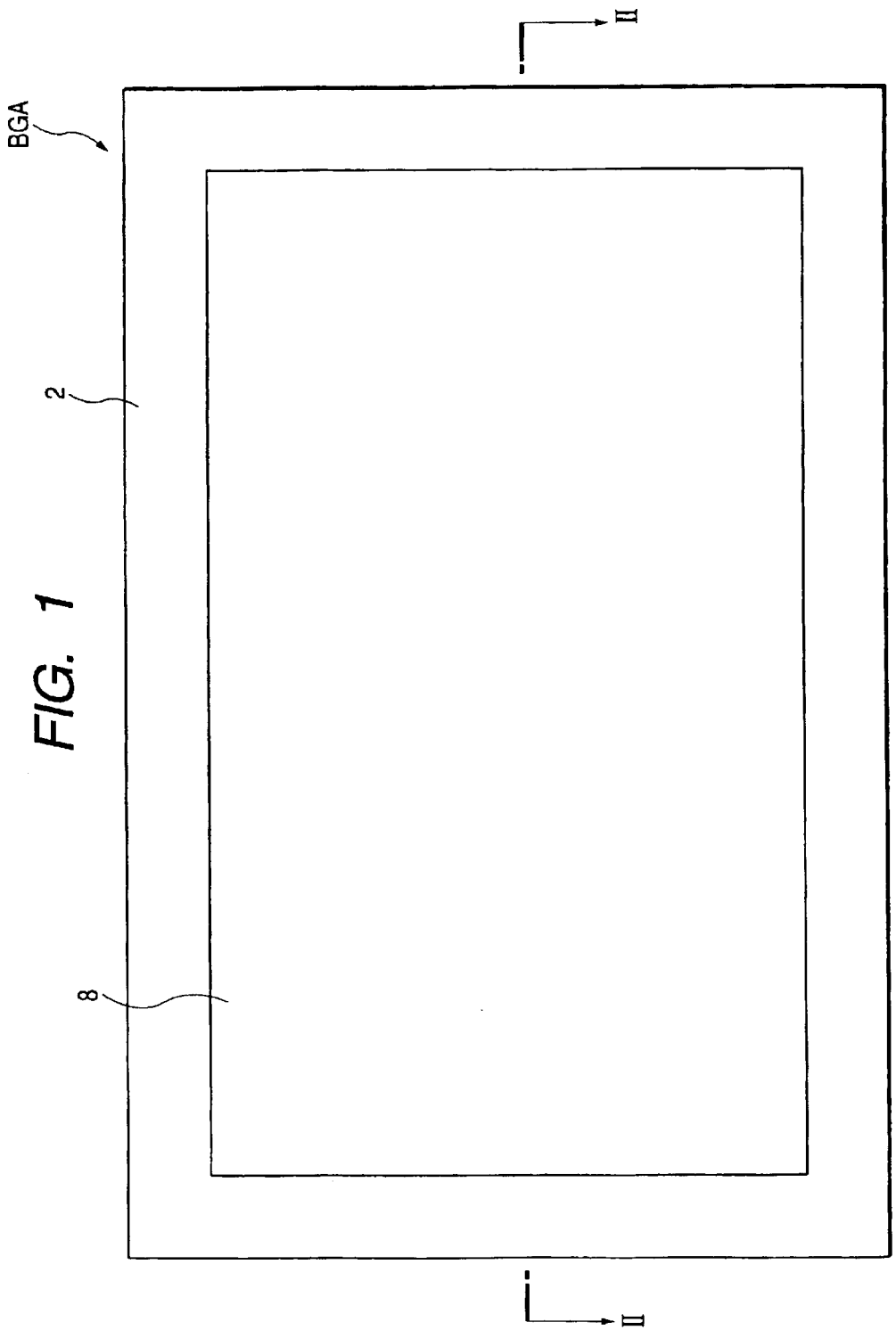
FIG. 1 is a plan view of a semiconductor device according to an embodiment of the present invention.

An embodiment of the present invention will be described in detail hereinunder with reference to the accompanying drawings. In all of the drawings for explaining the embodiment, components having the same functions are identified by like reference numerals, and repeated explanations thereof will be omitted. In the following embodiment, explanations of same or similar portions will not be repeated in principle except the case where a repeated explanation is necessary.

Figure 2:
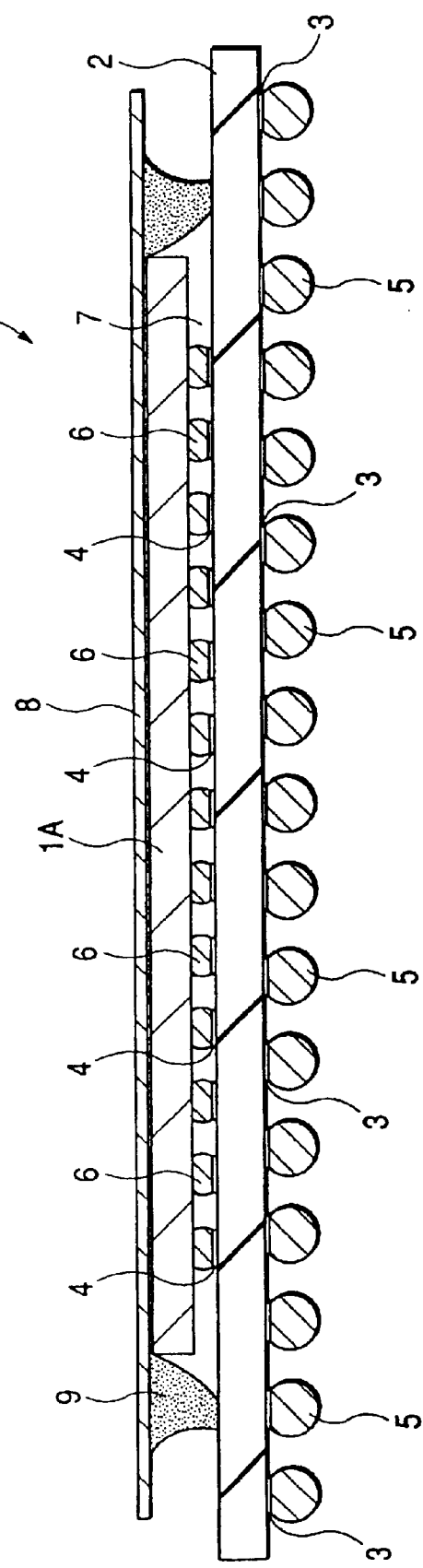
FIG. 2 is a sectional view taken along line II—II in FIG. 1.

FIG. 1 is a plan view of a semiconductor device according to this embodiment and FIG. 2 is a sectional view taken along line II—II in FIG. 1.

The semiconductor device of this embodiment is a BGA wherein a single silicon chip 1A is flip-chip-mounted on a main surface of a package substrate (wiring substrate) 2. An external size of the package substrate 2 is, for example, 22 mm×14 mm and that of the silicon chip 1A is, for example, 12.8 mm×10.3 mm. The silicon chip 1A is fabricated using what is called a wafer process package wherein a package process is handled by the application of such a wafer process (pre-process) as will be described later.

Figure 3:
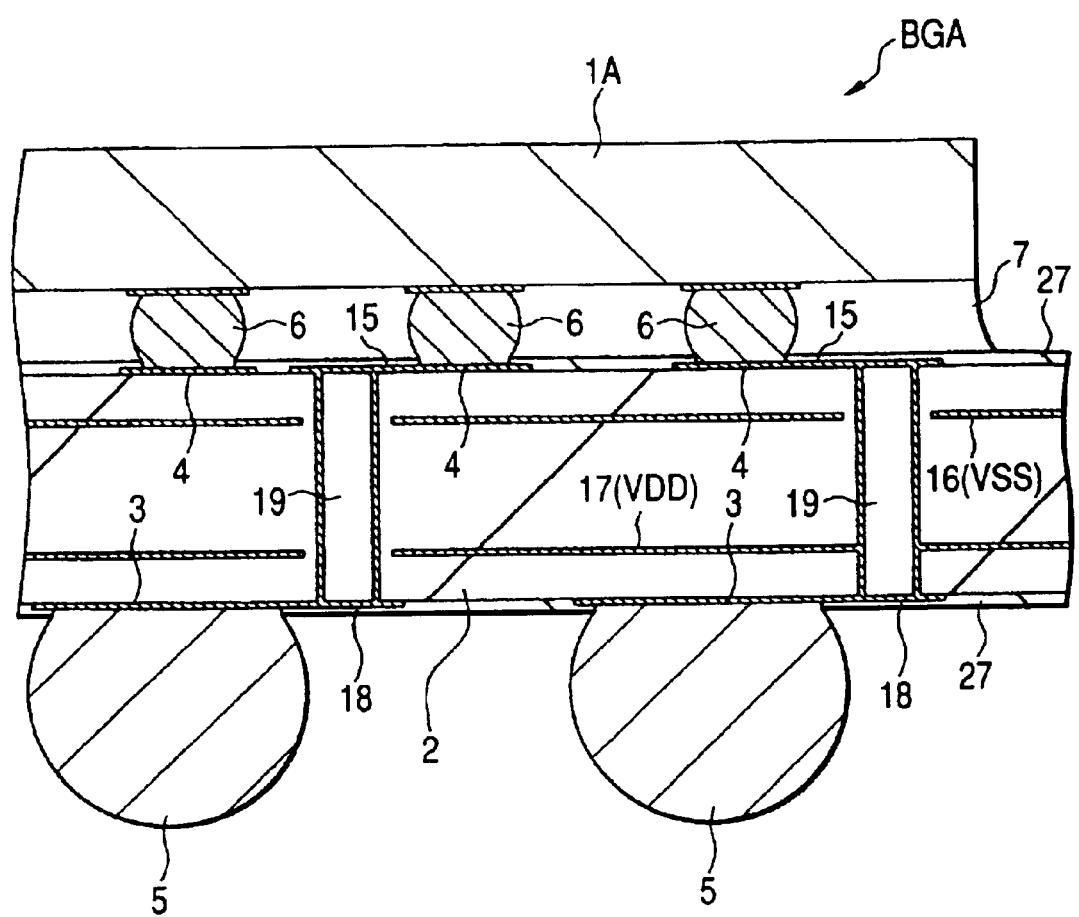
FIG. 3 is a partially enlarged sectional view of FIG. 2.

FIG. 3 is a partially enlarged sectional view of FIG. 2. As shown in the same figure, the package substrate 2 is a wiring substrate having an insulating layer formed of glass-epoxy resin or BT (Bismaleimide Triazine) or the like and four layers of Cu wirings 15 to 18 formed on an upper surface and a back surface of the insulating layer and also in the interior of the same layer.

Of the four layers of Cu wirings 15 to 18, the first layer of Cu wiring 15 formed on the upper surface of the package substrate 2 and the fourth layer of Cu wiring 18 formed on the back surface mainly constitute a signal wiring. The second layer of Cu wiring 16 formed in the interior of the package substrate 2 constitute a ground plane, while the third layer of Cu wiring 17 constitute a power supply plane. The first to third layers of Cu wirings 15, 16, 17 are connected to any of the fourth layer of wiring 18 via through holes 19 formed through the package substrate 2. The surface of the first layer of Cu wiring 15 is coated with a solder resist 27 except surfaces of the electrode pads 4 which are one end portion of the wiring 15. Likewise, the surface of the fourth layer of Cu wiring 18 is coated with solder resist 27 except surfaces of the electrode pads 3 which are one end portion of the wiring 18.

Figure 4:
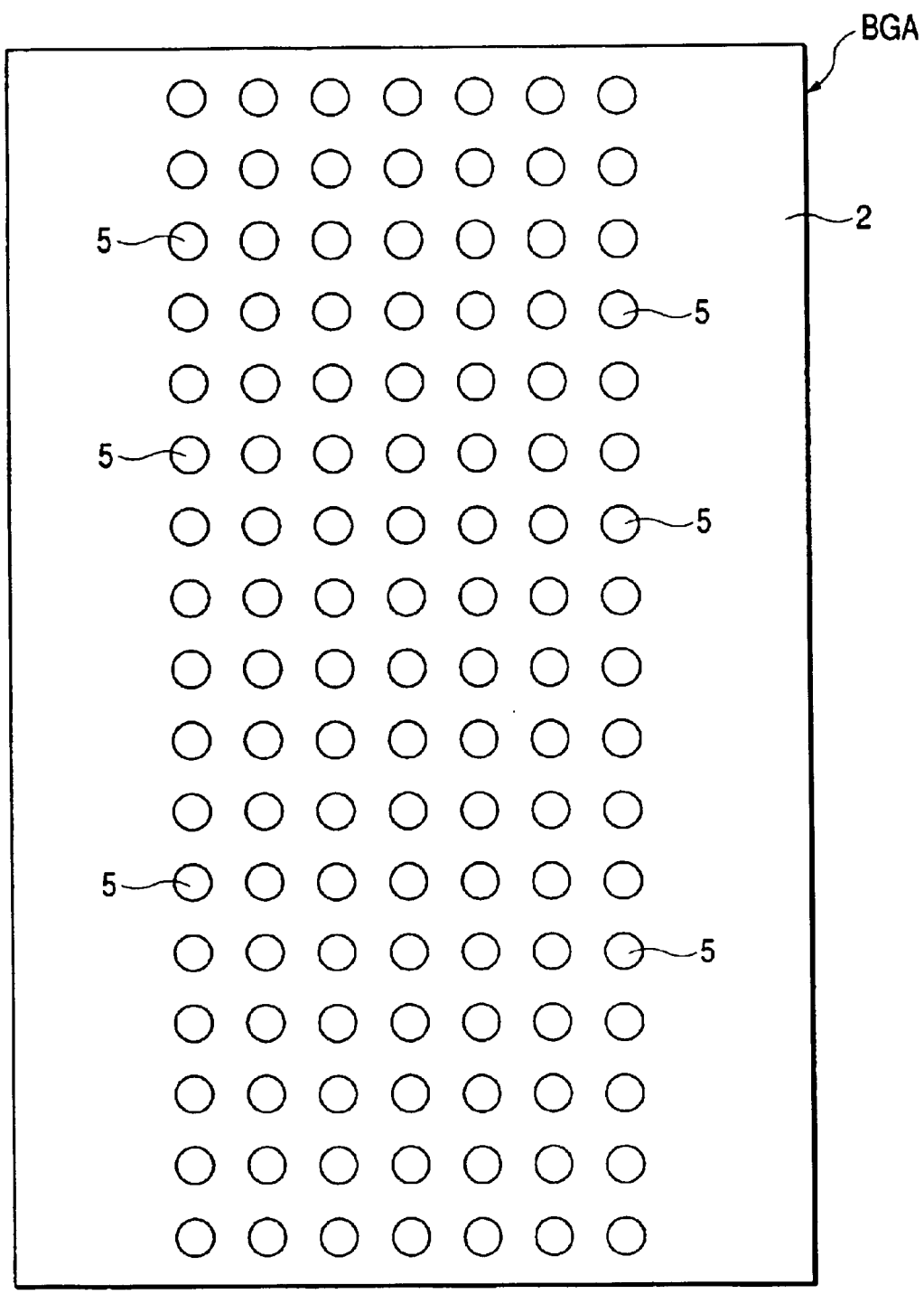
FIG. 4 is a plan view of the semiconductor device.

Solder balls 5 which constitute external connecting terminals of BGA are connected to the electrode pads 3 which are one end portion of the fourth layer of Cu wiring 18. As shown in FIG. 4, the solder balls 5 are arranged in matrix form on the back surface of the package substrate 2. For example, the number of solder balls 5 is 119.

Plural (214 for example) solder bumps 6 are formed on a main surface of the silicon chip 1A which is mounted on the package substrate 2, and are respectively connected electrically to corresponding electrode pads 4 formed on the package substrate 2. A gap formed between the silicon chip 1A and the package substrate 2 is filled with under-fill resin (sealing resin) 7 which is, for example, an epoxy resin with silicon filler incorporated therein. The under-fill resin fulfills both a function of relaxing a stress which is imposed on the solder bumps 6 as connections between the silicon chip 1A and the package substrate 2 due to a difference in thermal expansion coefficient between the two and a function of preventing the entry of water or the like onto the main surface of the silicon chip 1A. A metallic cover plate 8 for both protection of and heat radiation from the silicon chip 1A is affixed to a back surface (upper surface) of the silicon chip using an adhesive 9.

Figure 5:
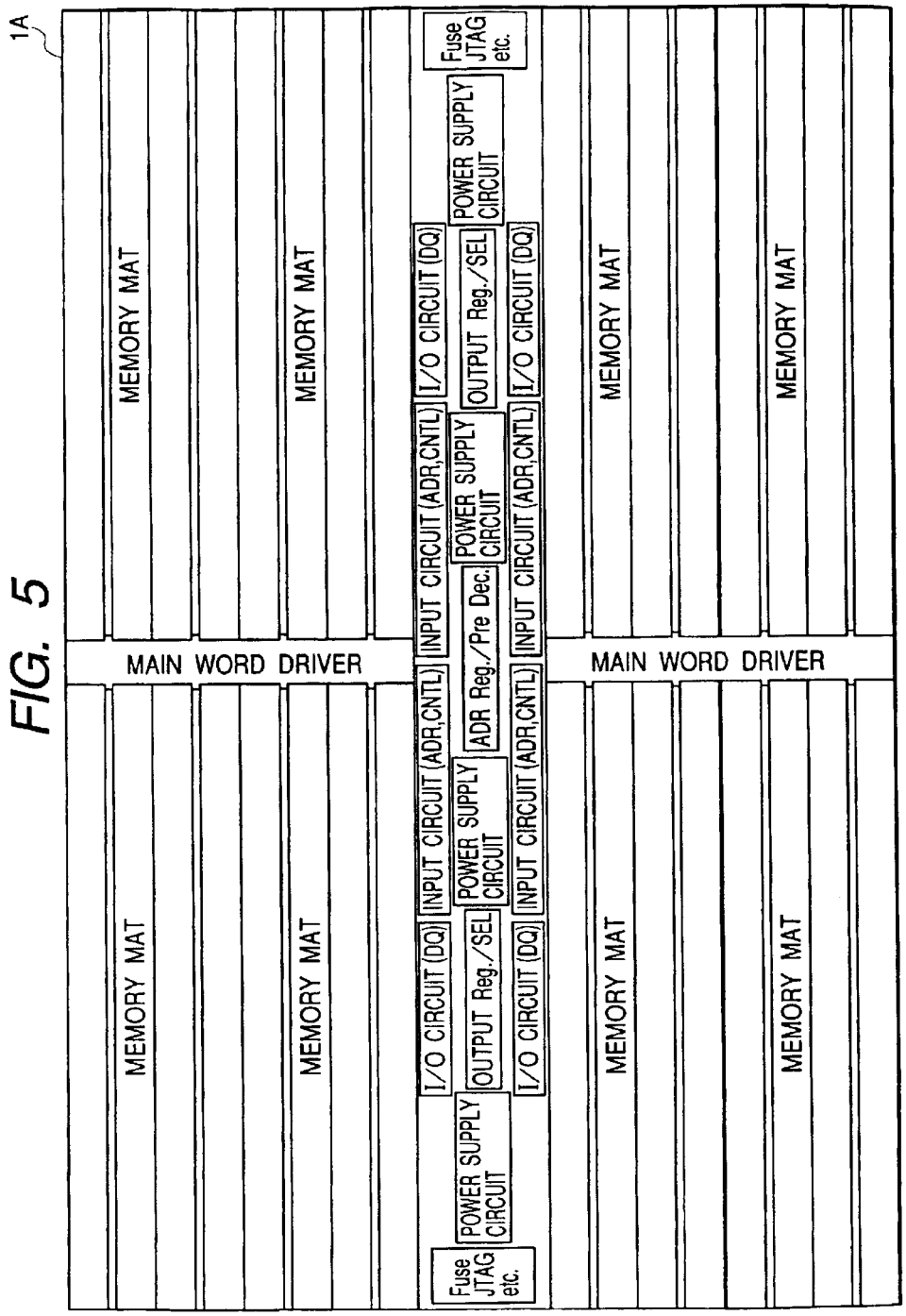
FIG. 5 is a plan view showing a circuit configuration of a semiconductor chip mounted on the semiconductor device.

On the main surface of the silicon chip 1A is formed a high-speed SRAM (Static Random Access Memory) which is used for example as a cache memory in a work station. As shown in FIG. 5, in a central area of the main surface of the silicon chip 1A are arranged power supply circuits and input/output circuits in the longitudinal direction of the silicon chip. The input/output circuits includes data input/output circuits (DQ), control input circuits (CNTL), and address input circuits (ADR), of which the control input circuits (CNTL) and address input circuits (ADR) are arranged inside the data input/output circuits (DQ). On both sides of the central area with those input/output circuits and power supply circuits arranged therein there is disposed a memory section of SRAM. The memory section is divided into plural memory mats and has a storage capacity of 32 megabits (Mbits) for example.

Figure 6:
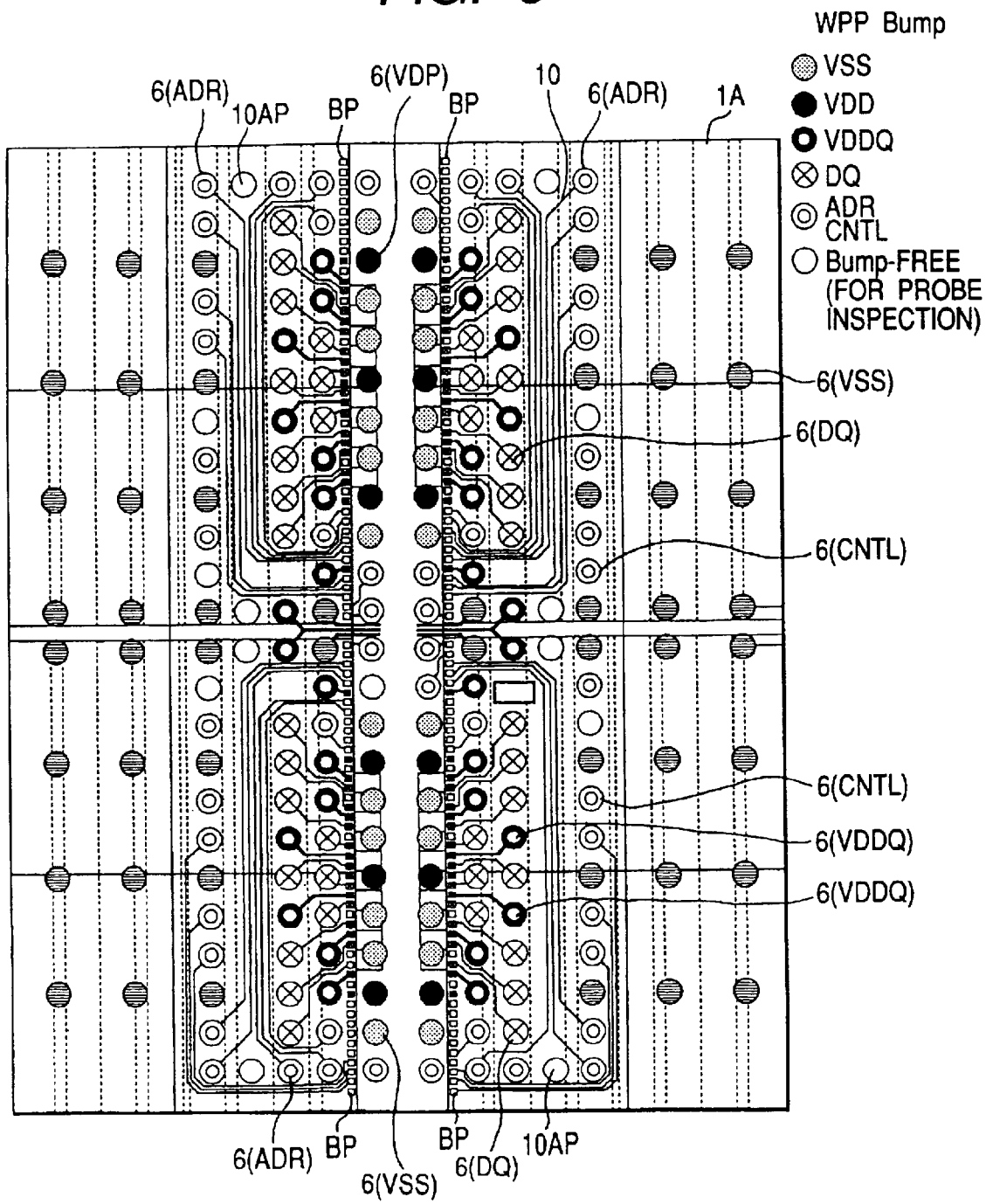
FIG. 6 is a plan view showing a bump electrode layout on the semiconductor chip mounted on the semiconductor device.

As shown in FIG. 6, on the surface of the silicon chip 1A are arranged the plural solder bumps 6 in a matrix form. The solder bumps 6 are mainly located on the memory section and another portion thereof are arranged in the central area where the power supply circuits and the input/output circuits are arranged. Further, bonding pads BP, which are electrically connected to the power supply circuits or the input/output circuits through Al wiring (not shown), are arranged in the central area of the silicon chip 1A in two rows in the longitudinal direction of the silicon chip 1A.

As shown in FIG. 6, the plural solder bumps 6 comprise solder bumps 6 (VDD) for power supply, solder bumps 6 (VSS) for ground, solder bumps 6 (VDDQ) for input/output power supply, solder bumps 6 (DQ) for the input and output of a data signal, solder bumps 6 (ADR) for the input of an address signal, and solder bumps 6 (CNTL) for the input of a control signal. Further, lands 10AP with solder bumps 6 not connected thereto are formed on part of the surface of the silicon chip 1A. The lands 10AP are used as test pads in probe inspection which is conducted in the silicon chip 1A manufacturing process to be described later.

In the BGA of this embodiment, bonding pads BP are electrically connected respectively through Cu wiring (metal wiring) 10 to mainly solder bumps 6 (VDDQ) for input/output power supply, solder bumps 6 (DQ) for the input and output of a data signal, and solder bumps 6 (ADR) for the input of an address signal, of the plural solder bumps 6. Likewise, bonding pads BP are electrically connected respectively through Al wiring (not shown in the drawing) to mainly solder bumps 6 (VDD) for power supply, solder bumps 6 (VSS) for ground, and solder bumps 6 (CNTL) for the input of a control signal. A portion of the solder bumps 6 (VDD) for power supply and that of the solder bumps 6 (VSS) for ground are connected through Cu wiring 10 to Al wiring for power supply or Al wiring for ground without through bonding pads BP.

In the BGA of this embodiment, the solder bumps 6 (VDDQ) for input/output power supply are arranged in an area (first area) adjacent to the central area where the power supply circuits and the input/output circuits are formed, thereby shortening the wiring length of the Cu wiring 10 which connects the solder bumps 6 (VDDQ) for input/output power supply and bonding pads BP with each other. By arranging the solder bumps 6 (VDDQ) for input/output power supply at such a position it is possible to diminish the impedance of the Cu wiring 10 in which there flows I/O power, so that the high-speed electric transmission characteristic of SRAM is improved.

In the BGA of this embodiment, moreover, by arranging the solder bumps (DQ) for the input and output of a data signal in the area (first area) adjacent to the central area, the wiring length of Cu wiring 10 which connects the solder bumps 6 (DQ) for the input and output of a data signal and bonding pads BP with each other is made short to attain the speed-up of a data signal.

In the BGA of this embodiment, the solder bumps 6 (ADR) for the input of an address signal are arranged substantially in one row in an area (second area) located outside the first area. Further, an area (third area) into which the Cu wiring 10 extends is formed between the first and second areas, and the Cu wiring 10 which connects the solder bumps 6 (ADR) for the input of an address signal and bonding pads BP with each other is disposed mainly in the third area.

In the BGA of this embodiment, the lands 10AP for probe inspection are arranged mainly in the row where the solder bumps 6 (ADR) for the input of an address signal are arranged. By arranging in such a position the lands 10AP with solder bumps 6 not connected thereto, the formation of such a large void as spans plural solder bumps 6 is suppressed at the time of filling the gap between the silicon chip 1A and the package substrate 2 with under-fill resin 7, so that it is possible to prevent short-circuit between solder bumps 6.

Figure 7:
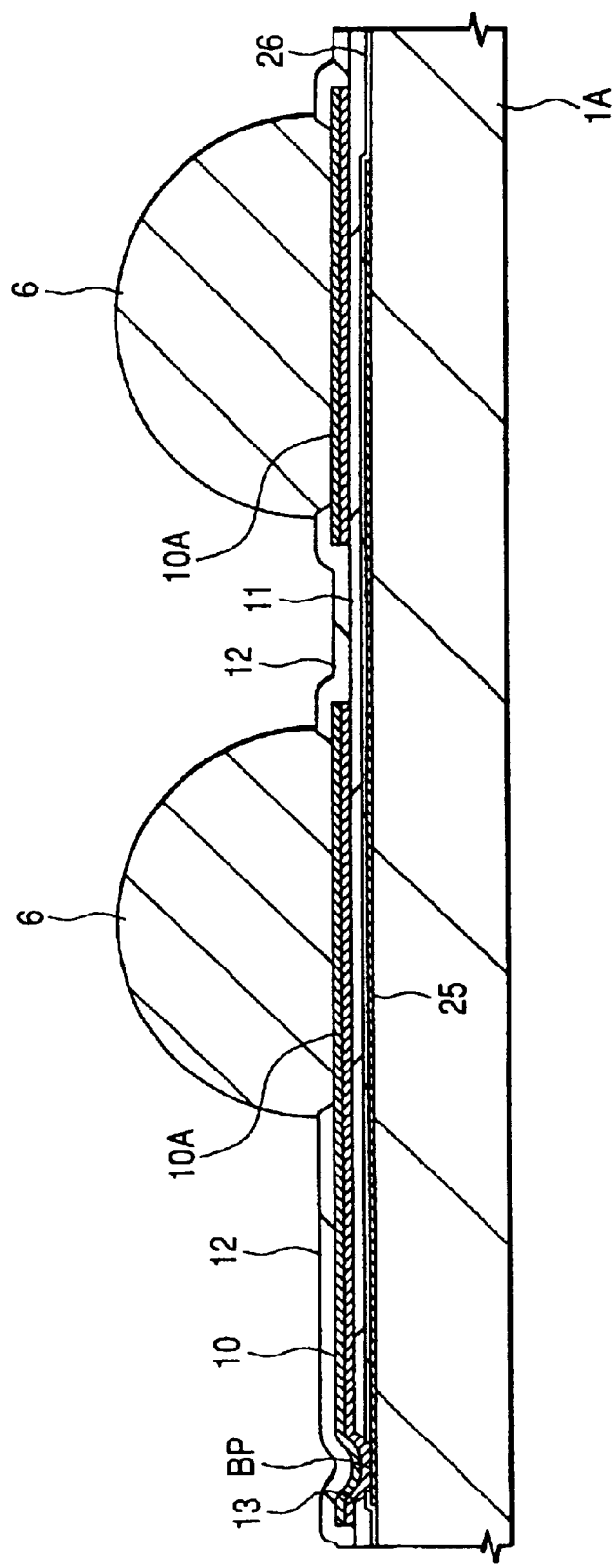
FIG. 7 is a sectional view of a principal portion of the semiconductor chip mounted on the semiconductor device.

FIG. 7 is a sectional view of a principal portion of the silicon chip 1A. The main surface of the silicon chip 1A, except the area where solder bumps 6 are formed, is covered with a top protective film 12 which is formed of a photosensitive polyimide resin for example. Below the top protective film 12 are formed Cu wiring 10 and lands 10A which constitute one end portion of the wiring 10, and solder bumps 6 are connected to upper surfaces of the lands 10A. Cu wiring 10 and lands 10A are each constituted by a laminate film of, for example, Cu film and Ni (nickel) film. A photosensitive polyimide resin film 11 underlies both Cu wiring 10 and lands 10A. An opposite end portion of Cu wiring 10 is electrically connected to the bonding pads BP through apertures 13 formed in the photosensitive polyimide resin film 11.

Figure 8:
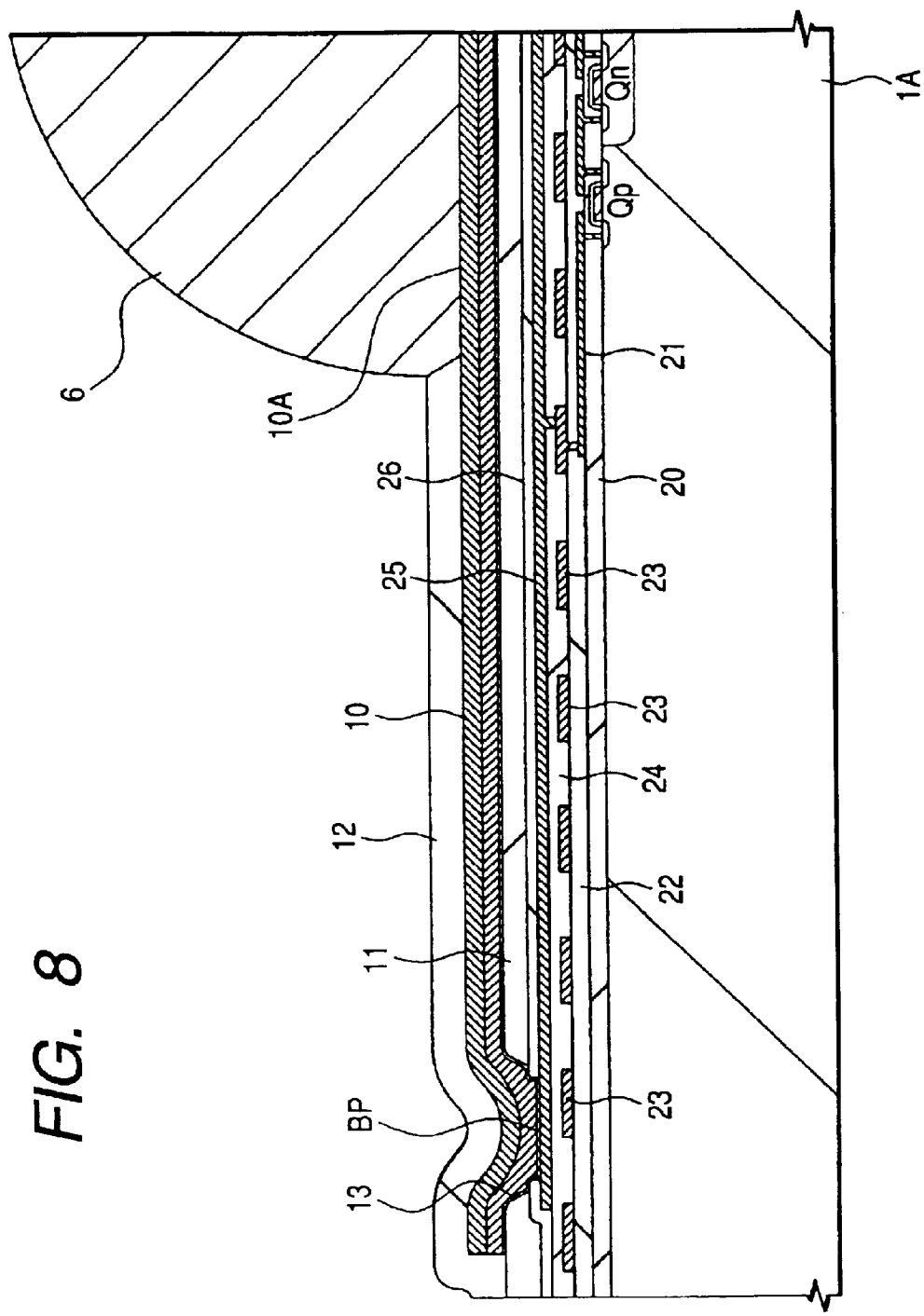
FIG. 8 is a partially enlarged sectional view of FIG. 7.

FIG. 8 is a partially enlarged sectional view of FIG. 7. On the main surface of the silicon chip 1A are formed an n-channel MISFET Qn and a p-channel MISFET Qp both constituting circuit components of SRAM. Above the n- and p-channel MISFETs Qn, Qp are formed, successively from below, insulating film 20, first-layer Al wiring 21, first inter-layer isolation film 22, second-layer Al wiring 23, second inter-layer isolation film 24, third-layer Al wiring 25, and inorganic passivation film 26. The insulating film 20 and the first and second inter-layer isolation films (22, 24) are each formed by a silicon oxide film, and the inorganic passivation film is formed by a laminate film of a silicon oxide film and a silicon nitride film. The bonding pads BP are formed by etching the inorganic passivation film 26 which overlies the third-layer Al wiring as the top-layer wiring, allowing a portion of the third-layer Al wiring 25 to be exposed.

Figure 9:
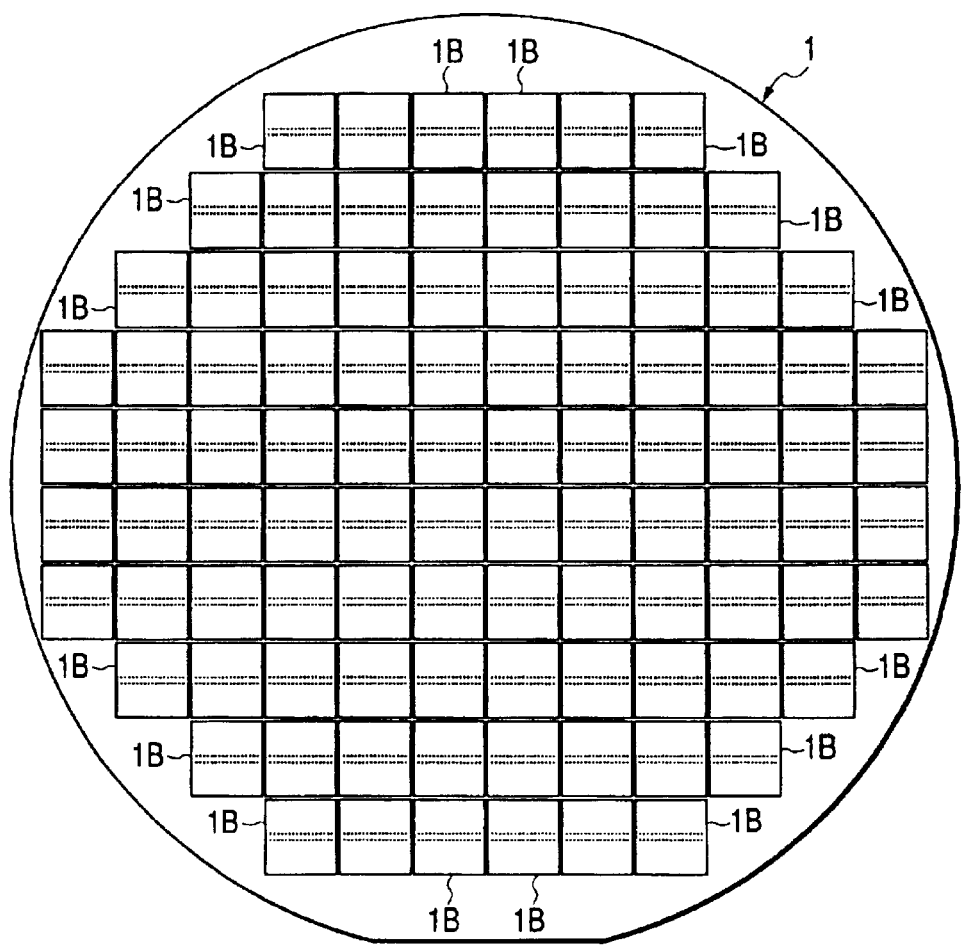
FIG. 9 is a plan view of a semiconductor wafer, showing a method for manufacturing the semiconductor device.

For fabricating the silicon chip 1A there first is provided such a silicon wafer 1 as shown in FIG. 9. Plural chip areas 1B are defined in matrix form on a main surface of the silicon wafer 1, and the SRAM having such a circuit block as shown in FIG. 5 is formed in each chip area 1B.

Figure 10:
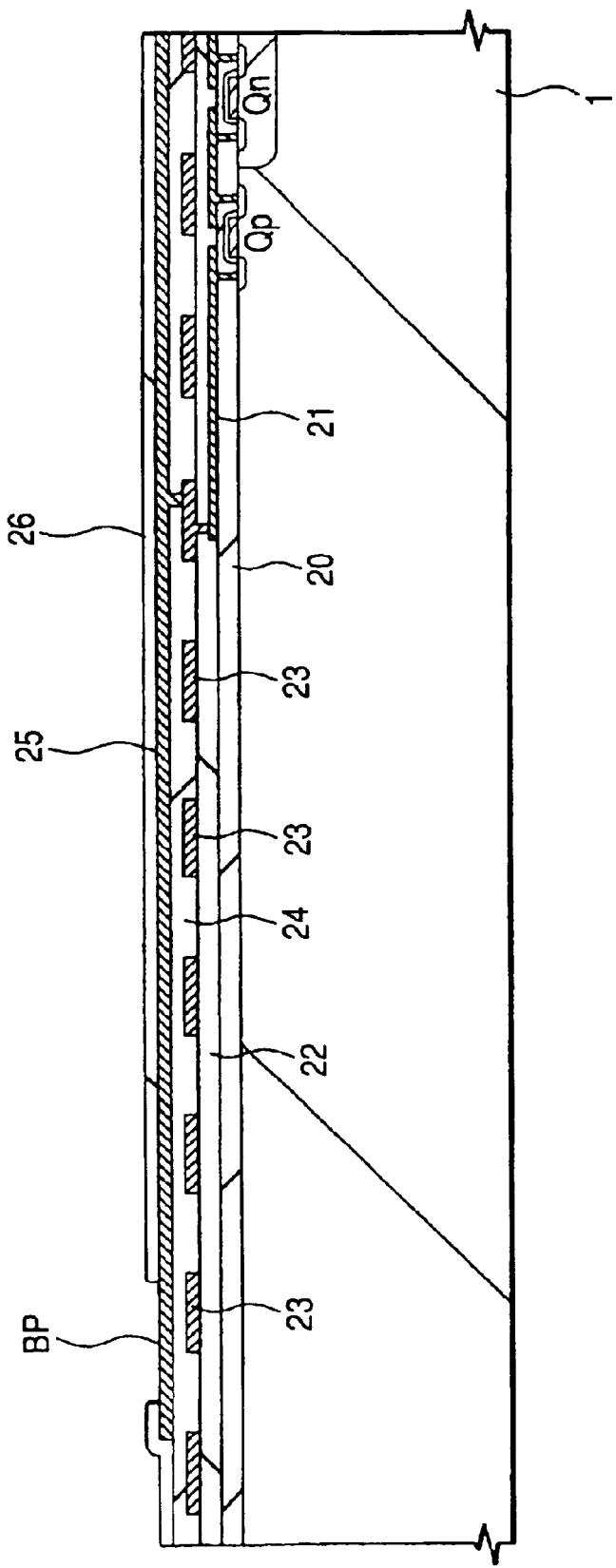
FIG. 10 is a sectional view of a principal portion of the semiconductor wafer, showing the semiconductor device manufacturing method.

As shown in FIG. 10, the circuit of SRAM is constituted by n-channel MISFET Qn, p-channel MISFET Qp, and first- to third-layer Al wirings (21, 23, 25). These MISFETs and Al wirings which constitute the SRAM circuit are formed by a known wafer process. Centrally of each chip area 1B are arranged bonding pads BP, the bonding pads BP being formed by etching the passivation film 26 which covers the surface of the third-layer Al wiring 25 as the top wiring layer to expose a portion of the third-layer Al wiring 25.

Figure 11:
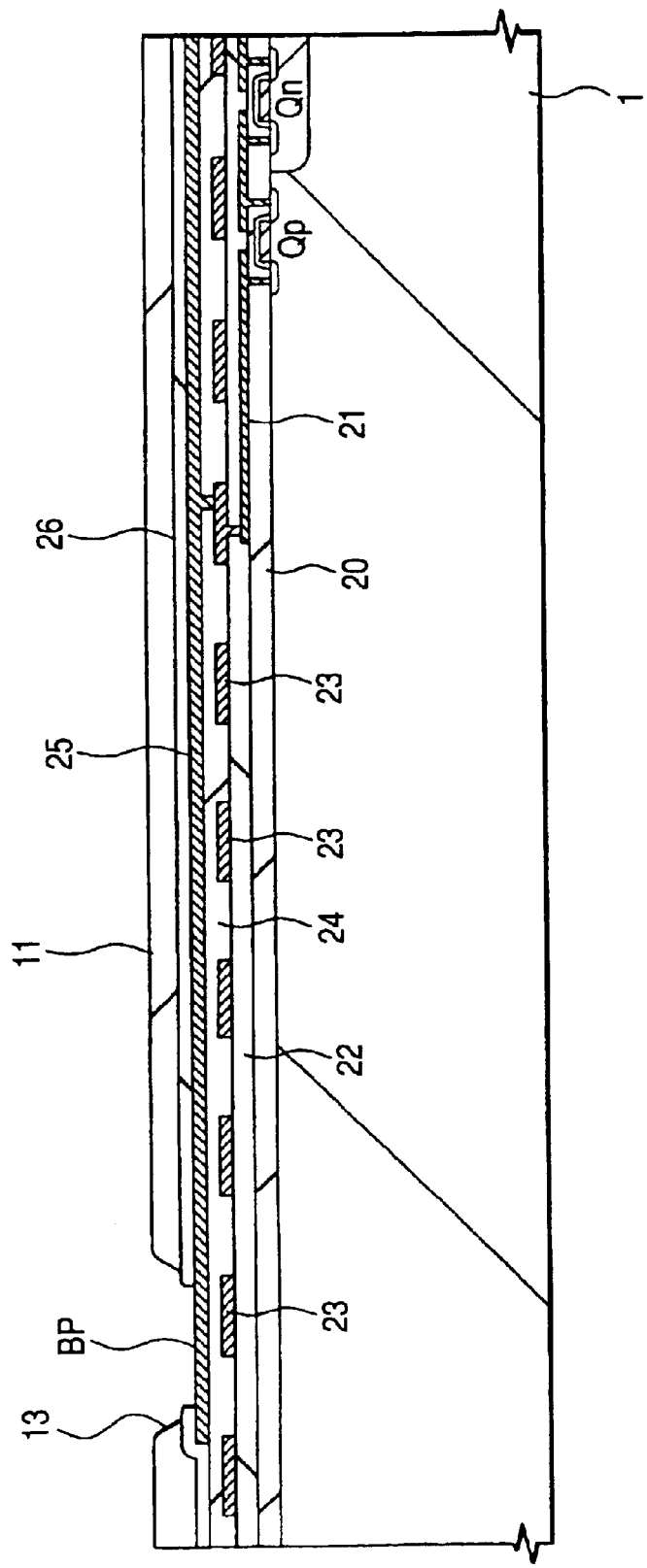
FIG. 11 is a sectional view of the principal portion of the semiconductor wafer, showing the semiconductor device manufacturing method.

Next, as shown in FIG. 11, a photosensitive polyimide resin film 11 is formed on the inorganic passivation film 26 by a spin coating method and thereafter apertures 13 are formed in the photosensitive polyimide film 11 to expose surfaces of the bonding pads BP. For forming the apertures 13, the photosensitive polyimide resin film 11 is half-hardened by exposure and baking in the other area than the portions located above the bonding pads BP and subsequently unexposed (unhardened) portions above the bonding pads BP are removed by development. The photosensitive polyimide resin film 11, together with the underlying inorganic passivation film 26, functions as an inter-layer isolation film which isolates the third-layer Al wiring 25 and later-formed Cu wiring 10 from each other.

Figure 12:
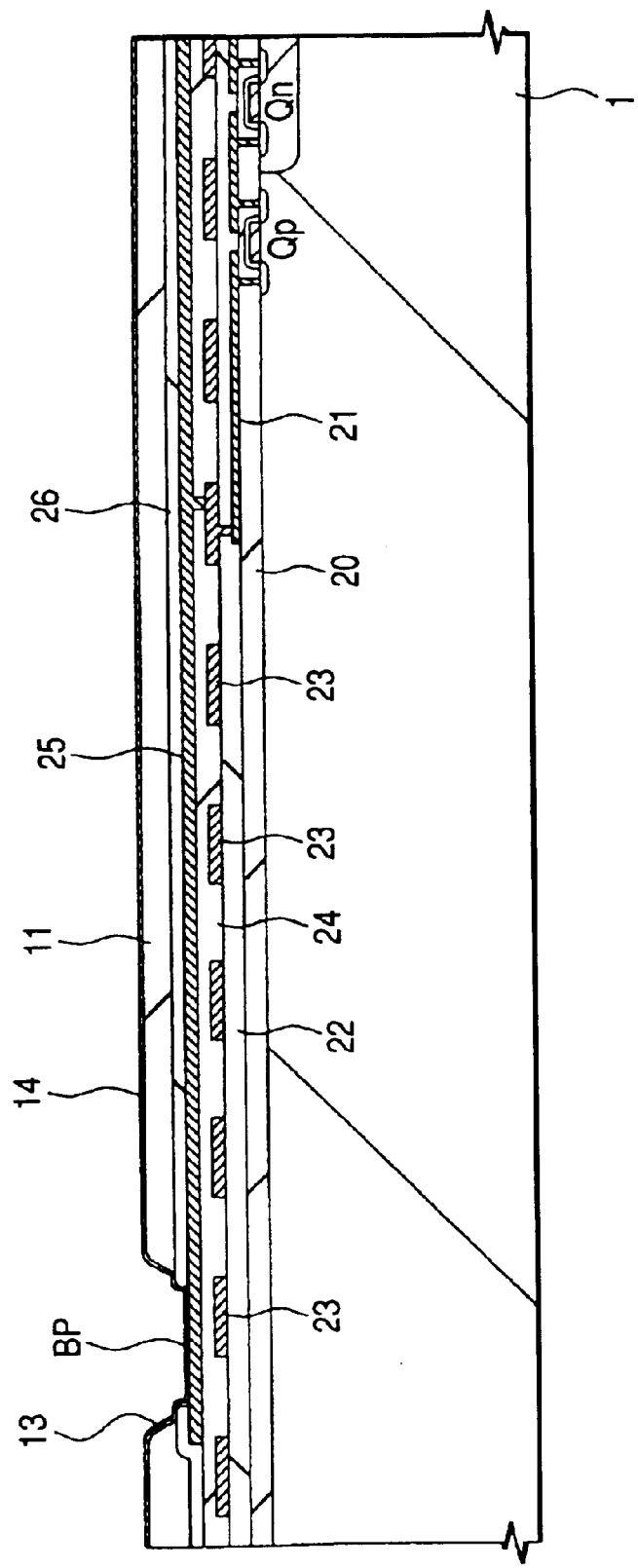
FIG. 12 is a sectional view of the principal portion of the semiconductor wafer, showing the semiconductor device manufacturing method.

Next, the semi-hardened photosensitive polyimide resin film 11 is hardened completely by baking the wafer 1 and thereafter, as shown in FIG. 12, a plating seed layer 14 is formed on the photosensitive polyimide resin film 11, including the surfaces of the bonding pads BP exposed to bottoms of the apertures 13. The plating seed layer 14 is constituted by a laminate film of both Cr film and Cu film deposited by sputtering for example.

Figure 13:
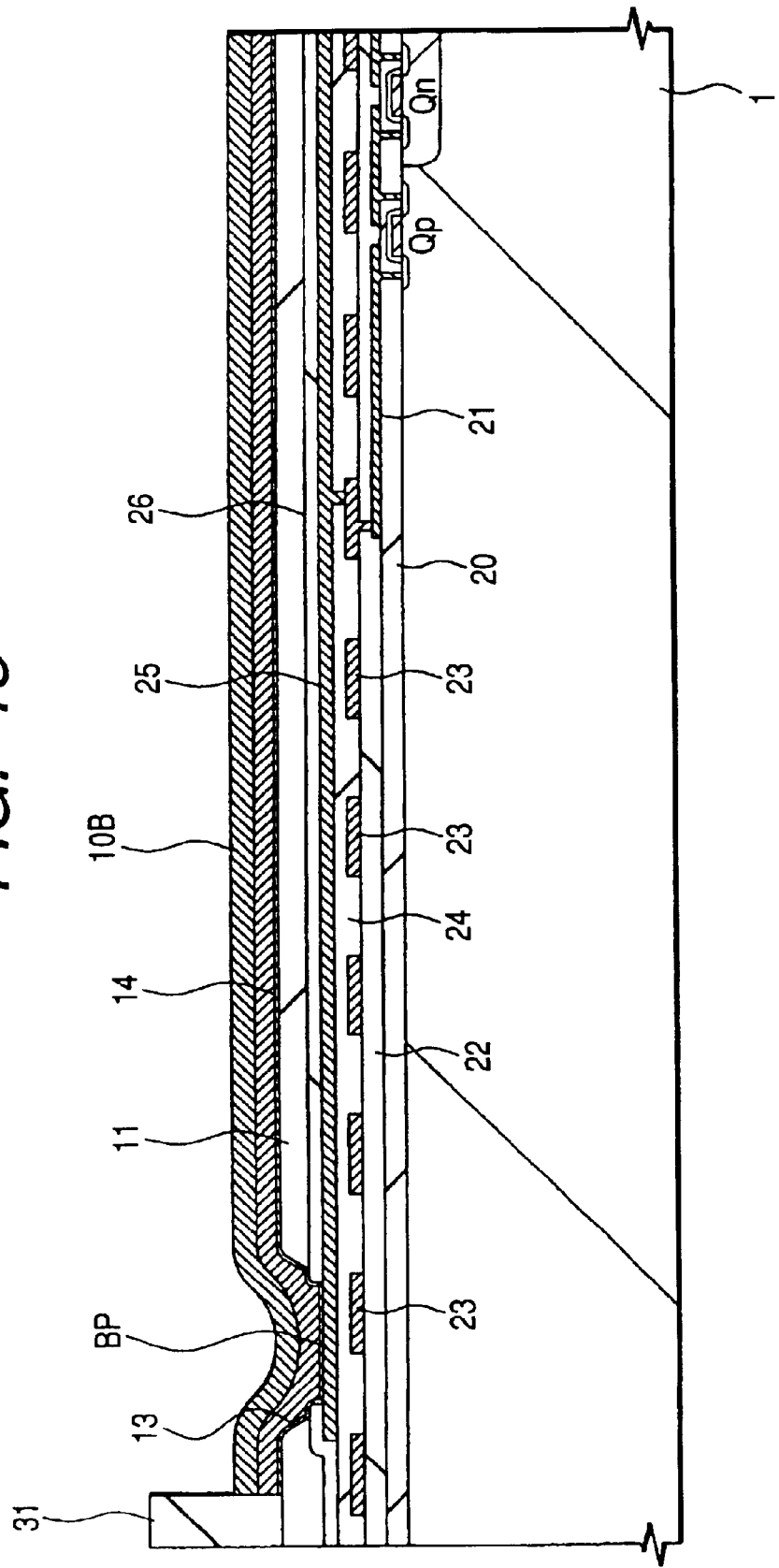
FIG. 13 is a sectional view of the principal portion of the semiconductor wafer, showing the semiconductor device manufacturing method.

Then, as shown in FIG. 13, a photoresist film 31, which is open in a Cu wiring forming area, is formed on the plating seed layer 14 and a metal film 10B is formed on the surface of the plating seed layer 14 by an electrolytic plating method using the photoresist film 31 as mask. The metal film 10B is constituted by a laminate film of Cu film and Ni film. The Ni film on the Cu film is formed for preventing the inconvenience that the lands 10A and the Cu wiring 10 become fragile due to diffusion of Sn in the Cu film which Sn is a main component of the solder bumps 6.

Figure 14:
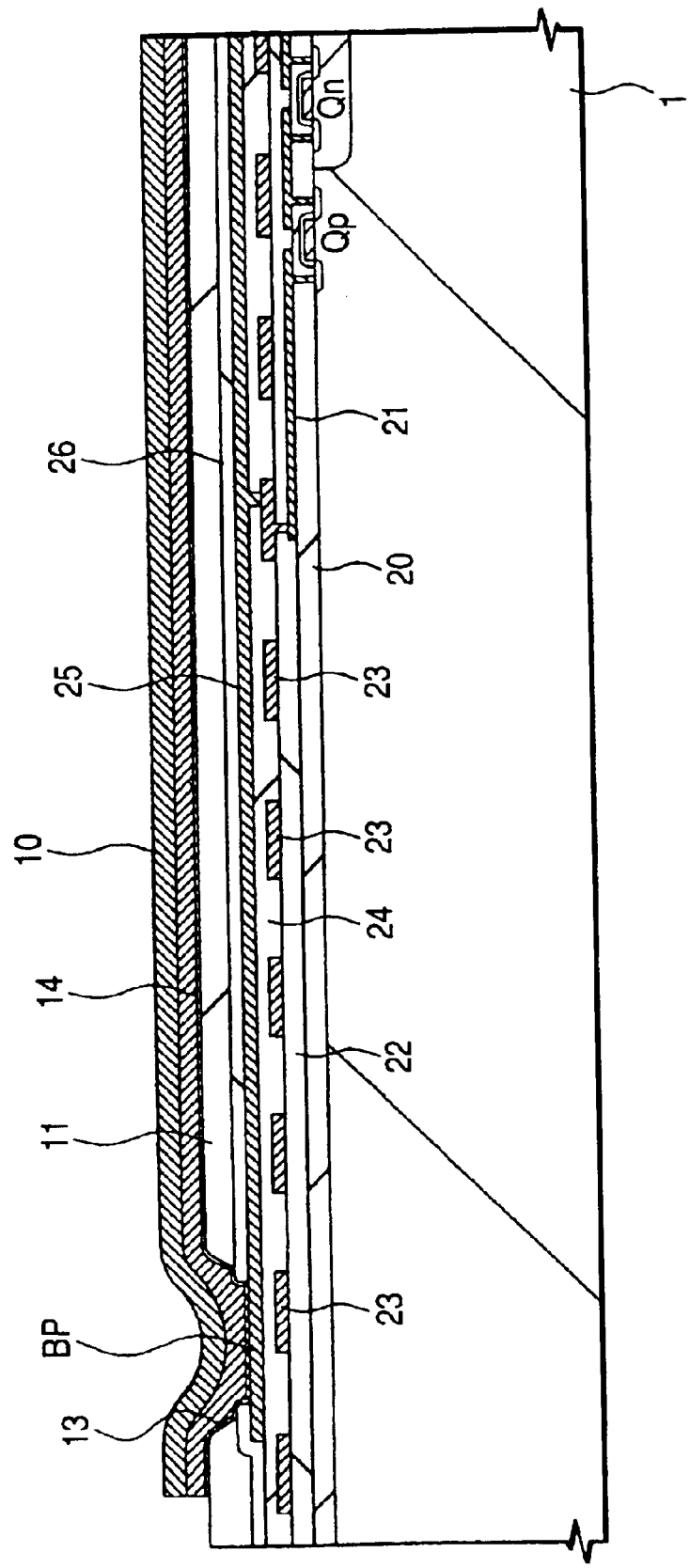
FIG. 14 is a sectional view of the principal portion of the semiconductor wafer, showing the semiconductor device manufacturing method.

Next, the photoresist film 31 is removed and thereafter, as shown in FIG. 14, unnecessary plating seed layer 14 remaining on the photosensitive polyimide resin film 11 in the other area than the Cu wiring forming area is removed by wet etching to form Cu wiring 10 constituted by the metal film 10B. When removing the plating seed layer 14 by wet etching, the surface of the metal film 10B (Cu wiring 10) is also etched at the same time, but there arises no problem because its film thickness is much larger than that of the plating seed layer 14.

Figure 15:
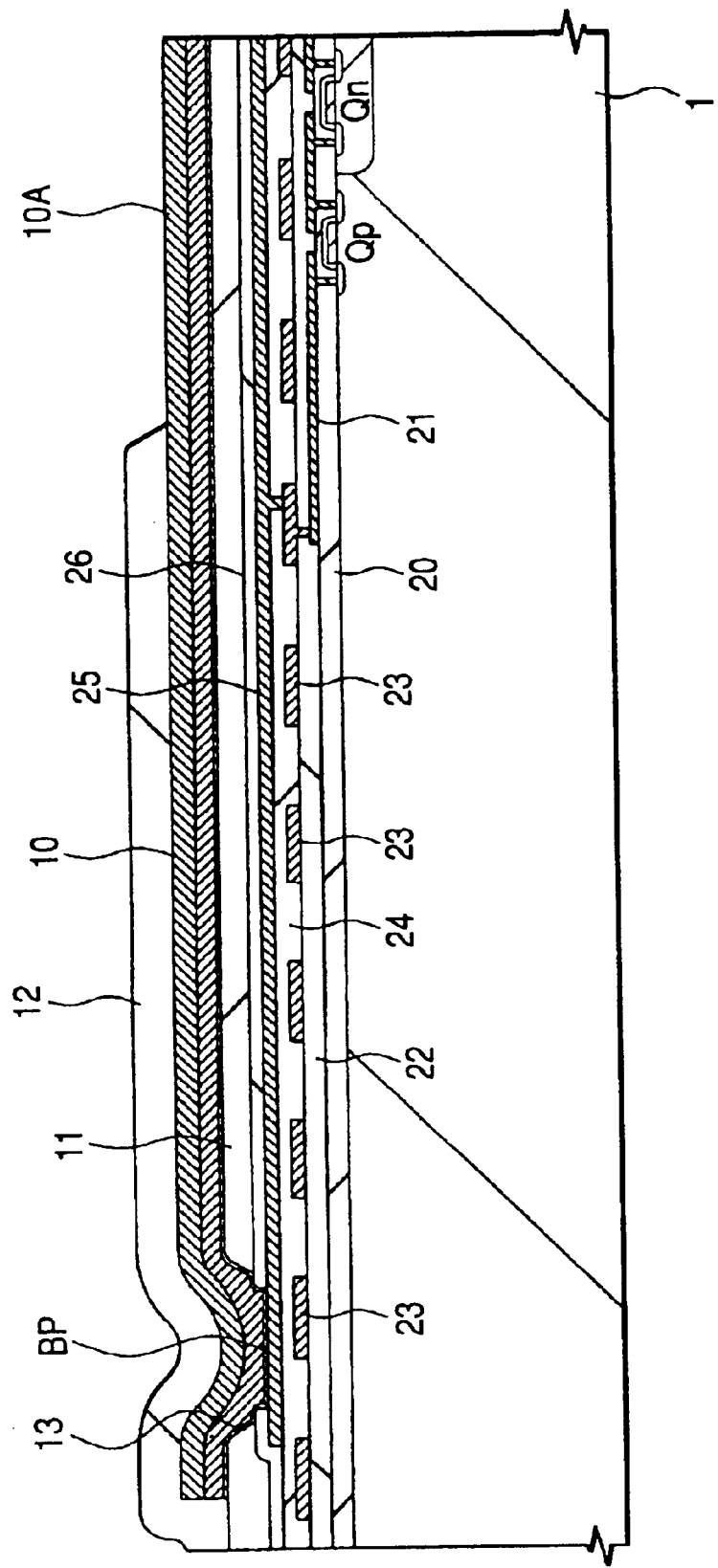
FIG. 15 is a sectional view of the principal portion of the semiconductor wafer, showing the semiconductor device manufacturing method.

Then, as shown in FIG. 15, a photosensitive polyimide resin film is formed on the Cu wiring 10 by spin coating to form a top protective film 12. Thereafter, the top protective film 12 on one end portion of the Cu wiring 10 is removed by exposure and development to form lands 10A.

Subsequently, probe inspection is performed for determining whether each chip area 1B is good or bad. This inspection is conducted by applying a probe to the lands 10A and dedicated lands 10AP formed for probe inspection.

Figure 16:
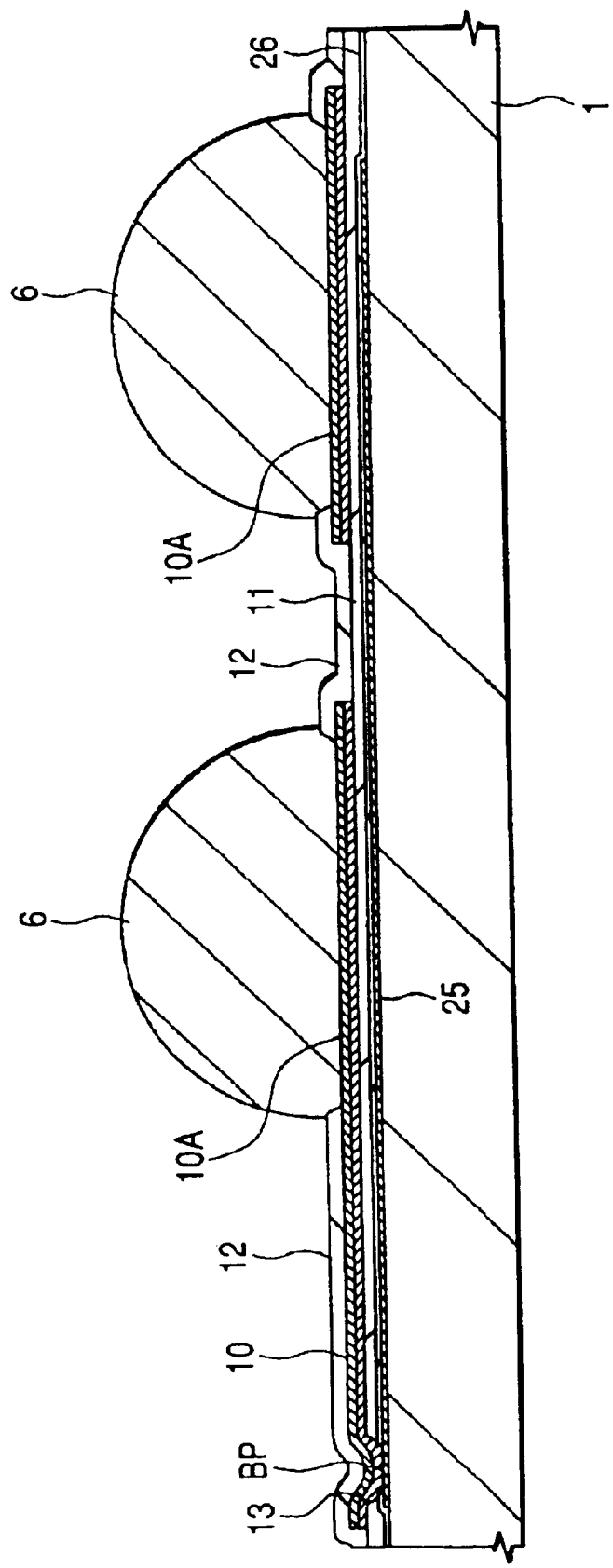
FIG. 16 is a sectional view of the principal portion of the semiconductor wafer, showing the semiconductor device manufacturing method.
Figure 17:
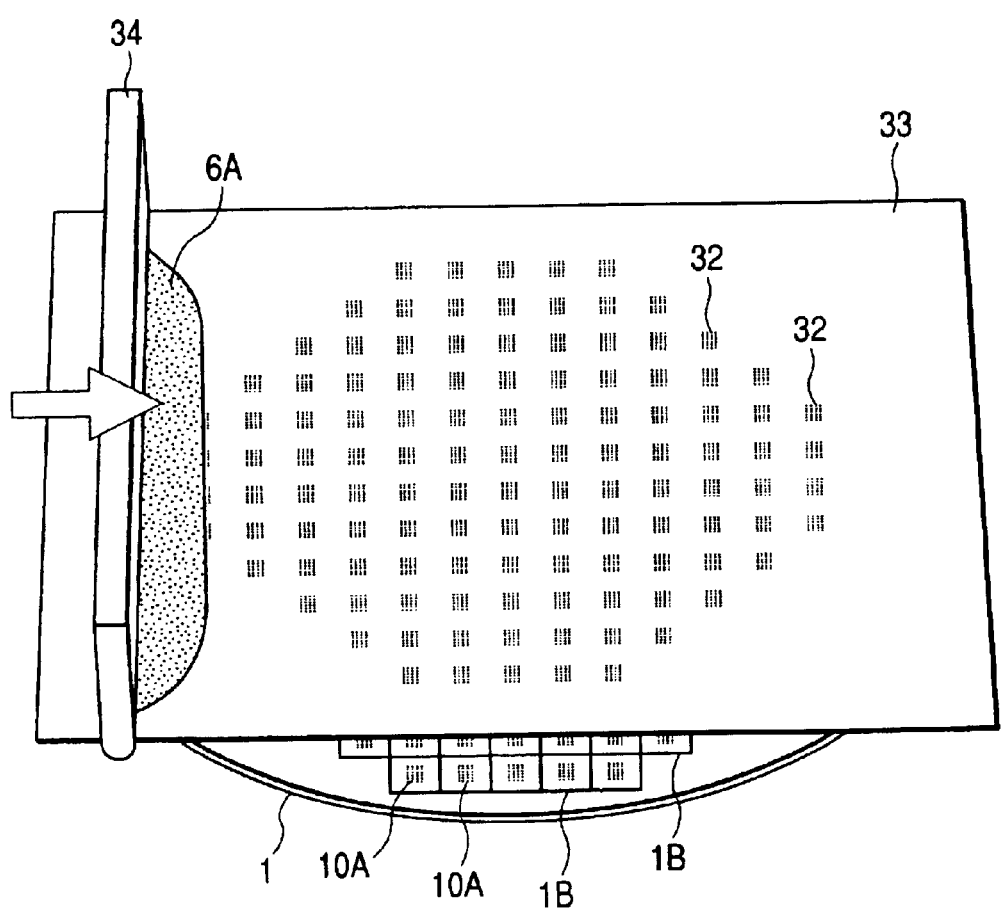
FIG. 17 is an explanatory diagram showing a bump electrode forming step for the semiconductor device.

Next, Au plating layer (not shown) is formed on the surface of each land 10A by an electroless plating method and thereafter, as shown in FIG. 16, solder bumps 6 are formed on the lands 10A. For forming the solder bumps 6, as shown in FIG. 17, a solder printing mask 33 having apertures 32 corresponding to the layout of lands 10A is superimposed on the main surface of the silicon wafer 1A and solder paste 6A is printed onto the lands with use of a squeegee 34. Thereafter, the silicon wafer 1 is heated, allowing the solder paste 6A on the lands 10A to reflow, whereby such spherical solder bumps 6 as shown in FIG. 16 are obtained. The solder bumps 6 may also be formed by a method involving feeding solder balls pre-formed in spherical shape to the upper surfaces of the lands 10A and subsequently heating the wafer 1 to reflow the solder balls.

Figure 18:
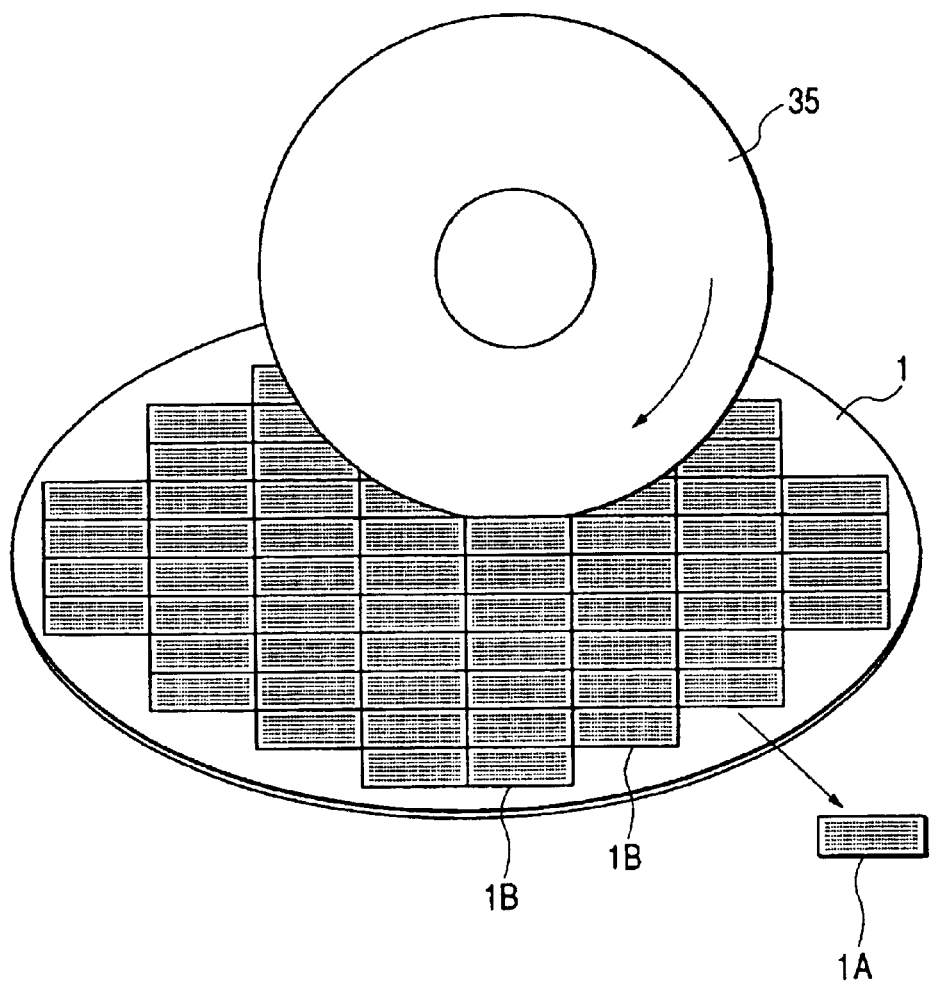
FIG. 18 is an explanatory diagram showing a wafer dicing step for the semiconductor device.

Then, as shown in FIG. 18, the wafer is diced into each individual chip area 1B by means of a dicing blade 35, whereby there is obtained such a silicon chip 1A as shown in FIGS. 5 and 6. The silicon chip 1A thus obtained is subjected to various final inspections, including performance and appearance inspections, then is accommodated in a tray jig and is conveyed to an assembling step, in which it is mounted onto the package substrate 2.

Figure 19:
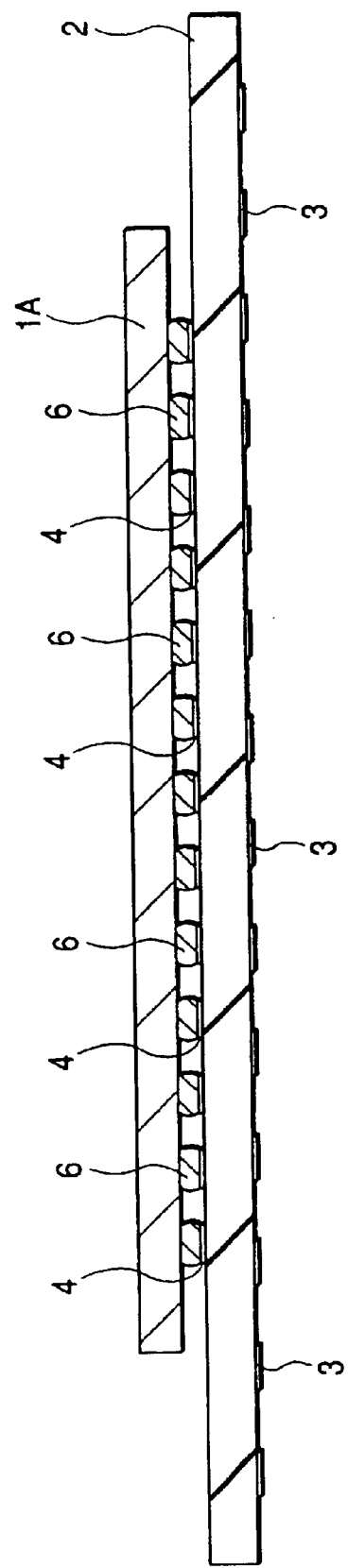
FIG. 19 is a sectional view showing a chip mounting step for the semiconductor device.

For mounting the silicon chip 1A onto the package substrate 2, as shown in FIG. 19, flux (not shown) is printed onto the electrode pads 4 formed on the supper surface of the package substrate 2, then the solder bumps 6 on the silicon chip 1A are positioned onto the corresponding electrode pads 4 and the package substrate 2 is heated to reflow the solder bumps 6, thereby connecting the solder bumps 6 and the electrode pads 4 with each other.

Figure 20:
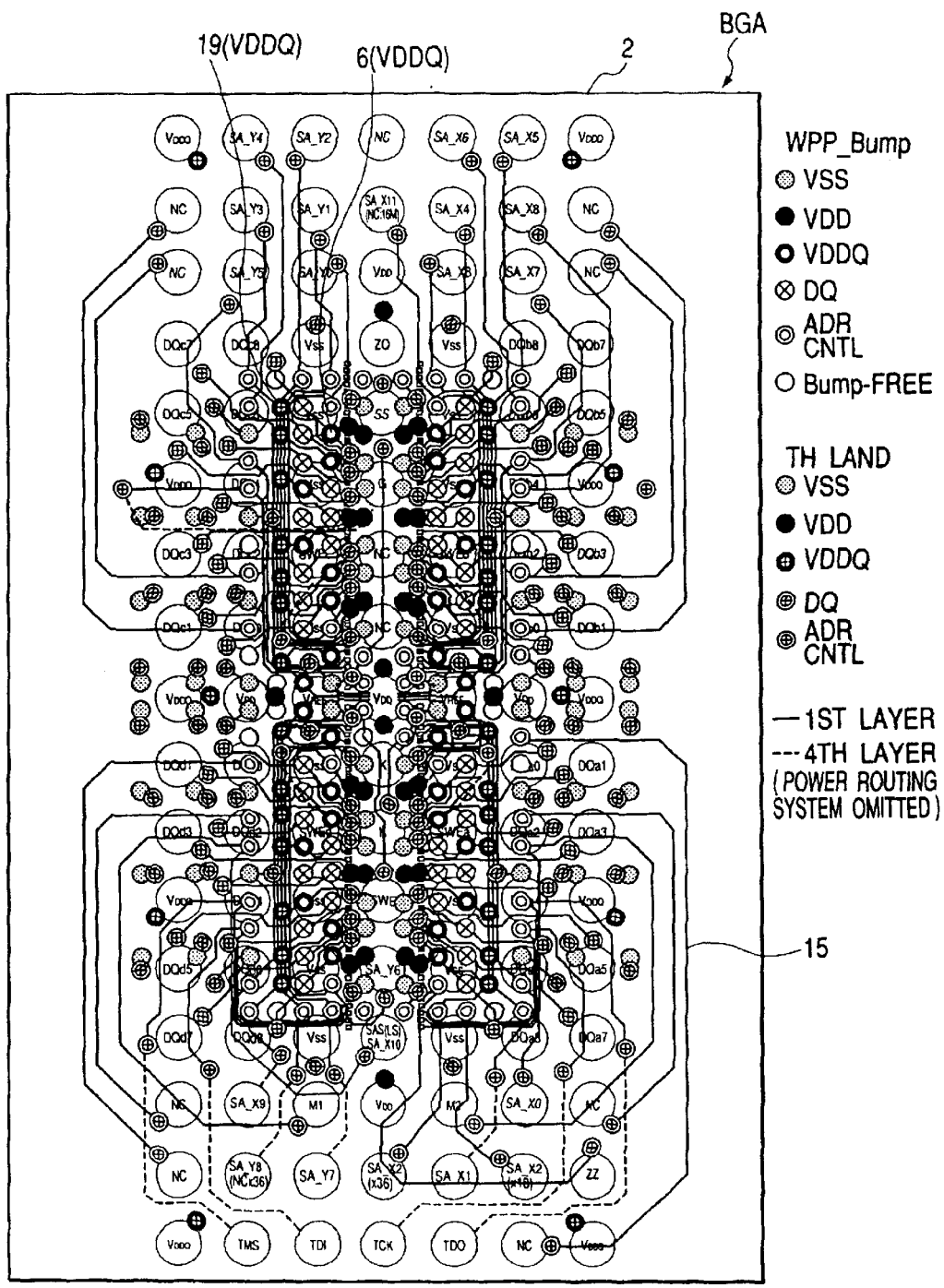
FIG. 20 is a plan view showing the layout of signal wiring and through holes formed on a wiring substrate of the semiconductor device, as well as the layout of metal wiring and bump electrodes formed on a semiconductor chip mounted on the wiring substrate.

FIG. 20 is a plan view showing a superimposed state of signal wirings (first-layer Cu wiring 15 and fourth-layer Cu wiring 18) on the package substrate 2 and through holes 19, as well as Cu wiring 10 and solder bumps 6 on the silicon chip 1A mounted on the package substrate 2.

As shown in the figure, of the through holes 19 formed on the package substrate 2, the through holes 19 (VDDQ) for input/output power supply connected to the third-layer power supply plane (Cu wiring 17 shown in FIG. 3) are arranged in an area opposed to the area (third area) in which Cu wiring 10 is disposed, the Cu wiring 10 connecting the solder bumps 6 (ADR) for address signal input formed on the silicon chip 1A and the bonding pads BP with each other. By arranging the through holes 19 (VDDQ) for input/output power supply in such a position, the wiring line from the electrode pads 4 on the package substrate 2 with the I/O power supply solder bumps 6 (VDDQ) connected thereto up to the power supply plane become short, so that the high-speed electric transmission characteristic of SRAM is improved.

Figure 21:
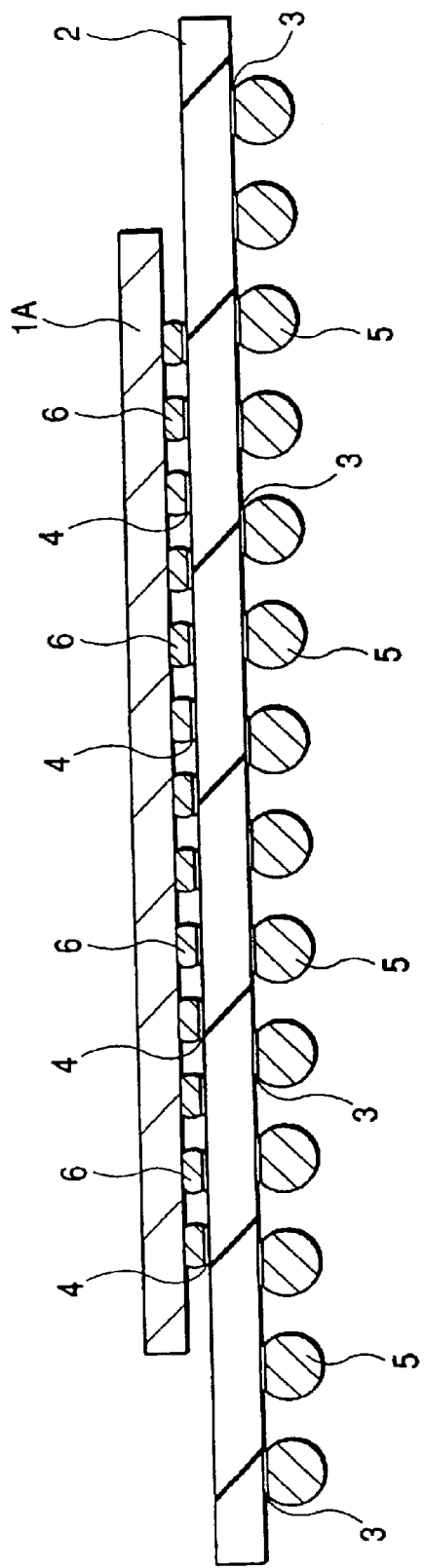
FIG. 21 is a sectional view showing the semiconductor device manufacturing method.

Next, as shown in FIG. 21, solder balls 5 are connected to the electrode pads 3 formed on the lower surface of the package substrate 2. For connecting solder balls 5 to the electrode pads 3, first flux is printed onto the surfaces of the electrode pads 4, then solder balls pre-formed in spherical shape are fed onto the electrode pads 3, and thereafter the wafer 1 is heated to reflow the solder balls.

Figure 22:
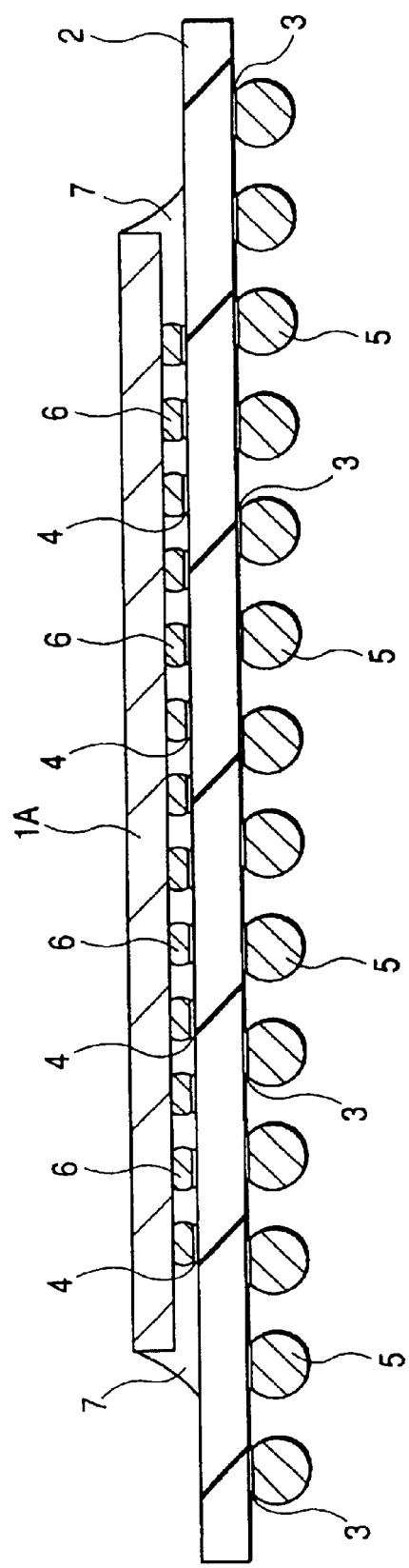
FIG. 22 is a sectional view showing the semiconductor device manufacturing method.

Then, the upper and lower surfaces of the package substrate 2 are washed to remove flux residue and thereafter, as shown in FIG. 22, the gap between the upper surface of the package substrate 2 and the main surface of the silicon chip 1A is filled with under-fill resin 7, followed by heat-hardening. Subsequently, a metallic cover plate 8 is affixed to the upper surface of the silicon chip 1A with use of an adhesive 9, followed by going through hardening of the adhesive 9 and burn-in inspection, to complete BGA of this embodiment.

The present invention has been described above concretely by way of an embodiment thereof, but it goes without saying that the invention is not limited to the above embodiment, but that various changes may be made within the scope not departing from the gist of the invention.

The silicon chip is not limited to SRAM chip, but may be such a memory as DRAM (Dynamic Random Access Memory) or flash memory, or a mixture of such memories.

The present invention is generally applicable widely to BGAs and multi-chip modules wherein a semiconductor chip for high-speed operations are required is flip-chip-mounted.

Effects obtained by typical modes of the present invention as disclosed herein will be outlined below.

According to one mode of the present invention it is possible to implement a flip-chip BGA superior in high-speed electric transmission characteristic.

According to another mode of the present invention it is possible to improve the reliability of a flip-chip BGA superior in high-speed electric transmission characteristic.

What is claimed is:

1. A semiconductor device in which a semiconductor chip is flip-chip-mounted over a wiring substrate through a plurality of bump electrodes formed over a main surface of the semiconductor chip, wherein a power supply circuit, an input/output circuit, and a plurality of pads are arranged in a central area of the main surface of the semiconductor chip, wherein the plurality of bump electrodes are arrayed in an area than the central area of the main surface of the semiconductor chip, the bump electrodes being electrically connected to the pads by metal wirings, wherein the plurality of bump electrodes include bump electrodes functionally connected with an input/output power supply, an input and output of a data signal, and an input of an address signal, wherein, of the plural bump electrodes, those for the input/output power supply and those for the input and output of a data signal are mainly arranged in a first area adjacent to the central area of the main surface of the semiconductor chip, wherein, of the plural bump electrodes, those for the input of an address signal are mainly arranged in a second area located outside the first area, wherein a gap between the semiconductor chip and the wiring substrate is filled with a sealing resin, and wherein lands integral with the metal wirings and to which the bump electrodes are not connected are arranged in the second area.

2. A semiconductor device according to claim 1, wherein, between the first and the second area of the semiconductor chip, a third area is provided in which a portion of the metal wirings which connect the bump electrodes for the input of an address signal to the pads is disposed.

3. A semiconductor device according to claim 2, wherein a plurality of electrode pads to which the bump electrodes for input/output power supply are connected are formed on a surface of the wiring substrate, and a power supply plane connected electrically to the electrode pads via through holes is formed in the interior of the wiring substrate, the through holes being arranged in an area opposed to the third area of the semiconductor chip.

4. A semiconductor device according to claim 1, wherein the metal wirings and the bump electrodes are formed in a wafer process.

5. A semiconductor device according to claim 1, wherein memory cells of SRAM are formed in an area other than the central area of the main surface of the semiconductor chip.

6. A semiconductor device according to claim 1, wherein the metal wirings are formed of copper film as a principal component.

7. A semiconductor device according to claim 1, wherein the bump electrodes are formed of a solder material which comprises tin as a principal component.

8. A semiconductor device according to claim 1, wherein a metallic cover plate is affixed to a back surface of the semiconductor chip using an adhesive.

9. A semiconductor device in which a semiconductor chip is flip-chip-mounted over a wiring substrate through a plurality of bump electrodes formed over a main surface of the semiconductor chip, wherein the main surface of the semiconductor chip has a first area, a second area and a third area, wherein an input/output circuit is arranged in the first area of the main surface of the semiconductor chip, wherein the plurality of bump electrodes are arrayed on the main surface of the semiconductor chip, wherein a gap between the semiconductor chip and the wiring substrate is filled with a sealing resin, wherein the plurality of bump electrodes include first bump electrodes arrayed with a first gap therebetween and second bump electrodes arrayed with a second gap therebetween, wherein the first bump electrodes are connected by metal wirings with the input/output circuits, and are arranged in the second area of the main surface of the semiconductor chip, wherein the second bump electrodes are arrayed in the third area, wherein the first gap is less than the second gap, wherein the second area is located between the first area and the third area, and wherein the third area is located between the second area and a side of the main surface of the semiconductor chip.

10. A semiconductor device according to claim 9, wherein the first area is a central area of the main surface of the semiconductor chip.

11. A semiconductor device according to claim 9, wherein lands integral with the metal wirings and to which the bump electrodes are not connected are arrayed in the second area.

12. A semiconductor device according to claim 9, wherein the plurality of bump electrodes include bump electrodes functionally connected to an input/output power supply, an input and output of a data signal, and an input of an address signal, wherein, of the first bump electrode in the plurality of bump electrodes, those for the input/output power supply and those for the input and output of a data signal are mainly arranged in the first area, and wherein, of the second bump electrodes in the plurality of bump electrodes, chose for the input of an address signal are mainly arrayed in the second area.

13. A semiconductor device according to claim 9, wherein a plurality of electrode pads to which the plurality of bump electrodes for an input/output power supply are connected are formed on a surface of the wiring substrate, and a power supply plane connected electrically to the electrode pads via through holes is formed in the interior of the wiring substrate, the through holes being arranged in an area opposed to the third area of the semiconductor chip.

14. A semiconductor device according to claim 9, wherein the metal wirings and the plurality of bump electrodes are formed in a wafer process.

15. A semiconductor device according to claim 9, wherein memory cells of SRAM are formed in an area other then the first area of the main surface of the semiconductor chip.

16. A semiconductor device according to claim 9, wherein the metal wirings are formed of copper film as a principal component.

17. A semiconductor device according to claim 9, wherein the bump electrodes are formed of a solder material which comprises tin as a principal component.

18. A semiconductor device according to claim 9, wherein a power supply circuit and a plurality of pads are arranged in the first area of the main surface of the semiconductor chip, and wherein the plurality of bump electrodes are electrically connected to the pads through the metal wirings.

* * * * *